United States Patent
Kirn et al.

(10) Patent No.: US 7,554,398 B2
(45) Date of Patent: Jun. 30, 2009

(54) INTEGRATION IMPROVEMENT TECHNIQUE FOR SWITCHING AMPLIFIERS

(76) Inventors: Larry Kirn, 2106 Kenwood, Austin, TX (US) 78704; Patrick Lucci, 130 Colon St., Beverly, MA (US) 01915; James Shanahan, 47 Rindge Rd., Union, CT (US) 06076

( * ) Notice: Subject to any disclaimer, the term of this patent is extended or adjusted under 35 U.S.C. 154(b) by 168 days.

(21) Appl. No.: 11/483,053

(22) Filed: Jul. 7, 2006

(65) Prior Publication Data

US 2007/0018724 A1      Jan. 25, 2007

Related U.S. Application Data

(60) Provisional application No. 60/697,115, filed on Jul. 7, 2005.

(51) Int. Cl.
   *H03F 3/217*      (2006.01)
(52) U.S. Cl. .................................. 330/251; 330/207 A

(58) Field of Classification Search .................. 330/10, 330/51, 207 A, 251; 370/212, 213; 375/238, 375/239
See application file for complete search history.

(56) References Cited

U.S. PATENT DOCUMENTS

| | | | |
|---|---|---|---|
| 6,211,735 B1 * | 4/2001 | Luu | 330/251 |
| 6,429,737 B1 * | 8/2002 | O'Brien | 330/10 |
| 6,492,868 B2 * | 12/2002 | Kirn | 330/10 |

* cited by examiner

*Primary Examiner*—Khanh V Nguyen
(74) *Attorney, Agent, or Firm*—Dorsey & Whitney LLP

(57) ABSTRACT

A method of synchronizing static or dynamic dissimilar output sampling rates of multiple outputs of an integrated switching amplifier uses the step of synchronizing dissimilar static or dynamic sampling rates of multiple outputs to yield improved sonic quality, higher efficiency, lower EMI or other benefits. According to the preferred embodiment, the synchronizing is carried out with respect to pulse leading edges.

26 Claims, 1 Drawing Sheet

INTEGRATION IMPROVEMENT TECHNIQUE FOR SWITCHING AMPLIFIERS

REFERENCE TO RELATED APPLICATION

This application claims priority from U.S. Provisional Patent Application Ser. No. 60/697,115, filed Jul. 7, 2005, the entire content of which is incorporated herein by reference.

FIELD OF THE INVENTION

This invention relates generally to switching amplifiers and, in particular, to a method of synchronizing static or dynamic dissimilar output sampling rates of multiple outputs of an integrated switching amplifier.

BACKGROUND OF THE INVENTION

Switching amplifiers, known in the art for many years, provide significant efficiency benefits over pre-existing Class A/B amplifiers. As Class D amplifiers proceed down the path of increased integration, it is found that the fact of integration itself can be leveraged to provide audio performance, efficiency, and EMI benefits; yet existing integrated switching amplifiers operate no better in concert than their non-intergrated ancestors. The need exists of a method whereby integrated switching amplifiers make direct use of increased integration.

SUMMARY OF THE INVENTION

The present invention resides in the method of synchronizing static or dynamic dissimilar output sampling rates of multiple outputs of an integrated switching amplifier. The technique uses the step of synchronizing dissimilar static or dynamic sampling rates of multiple outputs to yield improved sonic quality, higher efficiency, lower EMI or other benefits. According to the preferred embodiment, the synchronizing is carried out with respect to pulse leading edges.

DETAILED DESCRIPTION OF THE INVENTION

Figure 1:
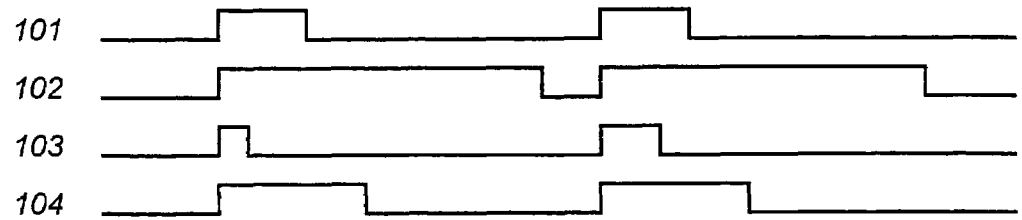
FIG. 1 is a timing diagram that shows synchronized output pulse widths of a four-channel integrated switching amplifier of the prior art.
Figure 2:
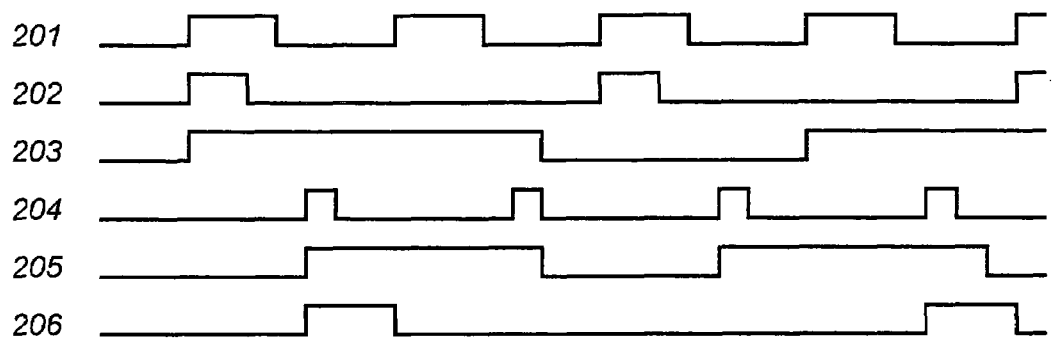
FIG. 2 is a timing diagram that shows static treble, midrange, and bass output pulse widths of a two-channel integrated switching amplifier using the present invention.
Figure 3:
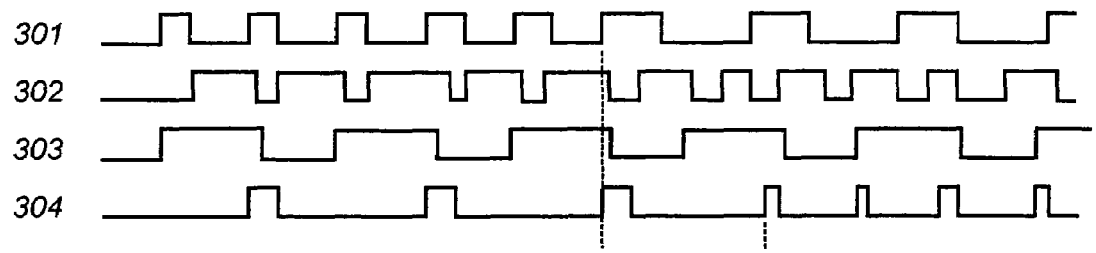
FIG. 3 is a timing diagram that shows output pulse widths of a four-channel integrated switching amplifier using dynamic output sample rates per the present invention.

FIG. 1 shows synchronized output pulse widths of a four-channel integrated switching amplifier of the prior art. FIG. 2 shows static treble, midrange, and bass output pulse widths of a two-channel integrated switching amplifier using the present invention. FIG. 3 shows output pulse widths of a four-channel integrated switching amplifier using dynamic output sample rates per the present invention.

Referring now to FIG. 1, the output pulse width of channel A is shown in waveform 101, the output pulse width of channel B is shown in waveform 102, the output pulse width of channel C is shown in waveform 103, and the output pulse width of channel D is shown in waveform 104. Note that the leading edges of pulses shown in traces 101, 102, 103, and 104 are all synchronized, and all are of the same sample rate.

Referring now to FIG. 2, the treble (tweeter) output of channel A is shown in waveform 201, the midrange output of Channel A is shown in waveform 202, the bass (woofer) output of channel A is shown in waveform 203, and the treble, midrange, and bass outputs of Channel B are shown in waveforms 204, 205, and 206, respectively. Integration of a signal-level crossover is assumed. Note that the pulse width leading edges in traces 204, 205, and 206 are 180 degrees delayed after the pulse width leading edges in traces 201, 202, and 203. This delay distributes the instantaneous current demand on the power supply, thereby reducing power supply ripple which can be transferred to the amplifier load as distortion. Note also that the pulse width sample rate of traces 202 and 205 is half the rate of the pulse width sample rate of traces 201 and 204; and that the pulse width sample rate of traces 203 and 206 is one third the rate of the pulse width sample rate of traces 201 and 204.

Because the highest reproducible frequency of the midrange outputs shown in traces 202 and 205 is less than that of the treble outputs shown in traces 201 and 104, the Nyquist criterion can be satisfied by a lower sample rate. Likewise, because the highest reproducible frequency of the bass outputs shown in traces 203 and 206 is less than that of the midrange output shown in traces 202 and 205, the Nyquist criterion can be satisfied at an even lower sample rate. Synchronization between the outputs is used to prevent heterodyne products. The benefits of the lower sampling rates used are reduced switching losses and lower EMI emissions.

Referring now to FIG. 3, four channels without crossovers are shown, similar to the outputs shown in FIG. 1. Note that the leading edges of the pulse widths of trace 302 and 304 are delayed by 180 degrees from the pulse widths of traces 301 and 303, to again minimize instantaneous currents demanded of the power supply. Note that the pulse widths of trace 301 show little high-frequency content. At point 305, the sample rate of channel A is therefore dropped to a sample rate which satisfies the Nyquist criterion of the current frequencies, but minimizes switching. Trace 302 shows channel B with constant high-frequency content, so its sample rate remains at the highest rate. Trace 303 shows channel B with only low-frequency content, so its sample rate remains reduced for the duration of the trace shown. Trace 304 starts with only low-frequency content, with resulting reduced sample rate, but, at point 306, is presented with high-frequency content (shown by rapid dynamic pulse widths) which cause, by the current invention, an increase to the maximum sample rate to satisfy the Nyquist criterion for the current input frequencies.

Although two sample rates only are shown in FIG. 3, it is anticipated that additional output sample rates may be used with differing maximum frequencies input. Note at each sample rate change 305 and 306 that the duty cycle of the affected trace 301 or 303 remains relatively constant, to preserve the sampling integral. It is assumed that any upstream upsampling filtering as well change characteristics so as to track the specific sample rate in effect.

By the techniques herein, it can be seen that integration of switching amplifiers can be leveraged to yield improved sonic quality, higher efficiency, and lower EMI. Although the present invention is shown applied to pulse widths synchronized on their leading edges, use of the present technique with alternate synchronization points in the pulse widths is as well anticipated.

We claim:

1. A method of improving the performance of a switching amplifier having a plurality of channels each configured to generate a respective output signal, the method comprising:
   selecting a first sampling rate for a first one of the plurality of channels that is different from a second sampling rate for another of the plurality of channels, wherein the selection based, at least in part on a frequency content of the output signal of the first one of the plurality of channels.

2. The method of claim 1, wherein the respective output signals each include pulses, the method further comprising:
   delaying rising edges of pulses of at least one of the plurality of channels relative to rising edges of the pulses of another of the plurality of channels.

3. The method according to claim 1, further comprising dynamically adjusting the first sampling rate according to the changing frequency content of the first one of the plurality of channels.

4. The method according to claim 1, wherein said selecting a first sampling rate is based on a lowest frequency that satisfies a Nyquist criteria for the first one of the plurality of channels.

5. The method according to claim 2, wherein the respective output signals are generated using a power supply, and the act of delaying rising edges operates to reduce an instantaneous current demand on the power supply.

6. A method of improving the performance of a switching amplifier, the method comprising:
   generating a first output signal of the switching amplifier using a first sampling frequency;
   generating a second output signal of the switching amplifier using a second sampling frequency different from the first sampling frequency;
   selecting at least one of the first and second sampling frequencies based, at least in part, on a frequency content of the respective first and second output signals; and
   delaying at least one of the first and second output signals relative to the other.

7. The method of claim 6, wherein the second sampling frequency is one-half the first sampling frequency.

8. The method of claim 6, wherein the second sampling frequency is one-third the first sampling frequency.

9. The method of claim 6, further comprising
   generating a third output signal of the switching amplifier using a third sampling frequency different from the first and second sampling frequencies.

10. The method of claim 9, wherein the second sampling frequency is one-half the first sampling frequency and the third sampling frequency is one-third the first sampling frequency.

11. The method of claim 6, wherein the first and second sampling frequencies are selected based at least in part on a frequency content of the first and second output signals, respectively.

12. The method of claim 11, wherein the first and second sampling frequencies are based, at least in part, on a frequency able to satisfy a Nyquist criteria for the first and second output signals.

13. The method of claim 6, further comprising
   delaying the second output signal relative to the first output signal.

14. The method of claim 6, further comprising
   dynamically changing at least one of the first and second sampling frequencies in response to a change in frequency content of at least one of the first and second output signals, respectively.

15. A switching amplifier, comprising:
   a first output configured to transmit a first output signal having a first sampling frequency;
   a second output configured to transmit a second output signal having a second sampling frequency;
   a sampling frequency selector circuit configured to select at least one of the first and second sampling frequencies based, at least in part, on a frequency content of the respective first and second output signals; and
   a delay control circuit configured to delay at least one of the first and second output signals relative to the other.

16. The switching amplifier of claim 15, further comprising a power supply configured, at least in part, to generate the first and second output signals, wherein the act of delaying the at least one of the first and second output signals operates to adjust a current demand at the power supply.

17. The switching amplifier of claim 15, wherein the switching amplifier comprises a Class D amplifier.

18. The switching amplifier of claim 15, further comprising
   an integrated crossover configured to generate the first and second output signals, wherein each output signal corresponds to a respective frequency range.

19. The switching amplifier of claim 18, wherein the first and second sampling frequencies are selected based, at least in part, on the respective frequency ranges.

20. A system, comprising:
   a load; and
   a switching amplifier coupled to the load, wherein the switching amplifier includes:
      a first output configured to transmit a first output signal having a first sampling frequency;
      a second output configured to transmit a second output signal having a second sampling frequency;
      a sampling frequency selector circuit configured to select at least one of the first and second sampling frequencies based, at least in part, on a frequency content of the respective first and second output signals; and
      a delay control circuit configured to delay at least one of the first and second output signals relative to the other.

21. The system of claim 20, wherein the load comprises a speaker.

22. The system of claim 20, wherein the switching amplifier further comprises a power supply configured, at least in part, to generate the first and second output signals, wherein the act of delaying at least one of the first and the second output signals operates to adjust a current demand at the power supply.

23. The system of claim 20, wherein the switching amplifier comprises a Class D amplifier.

24. The system of claim 20, further comprising
   an integrated crossover configured to generate the first and second output signals, wherein each output signal corresponds to a respective frequency range.

25. The system of claim 20, wherein the first and second sampling frequencies are selected based, at least in part, on the respective frequency ranges.

26. The system of claim 25, wherein the load comprises a tweeter speaker and a woofer speaker, and wherein the first output signal corresponds to a frequency range suitable for the tweeter and the second output signal corresponds to a frequency range suitable for the woofer.

* * * * *